United States Patent [19]
Vulih et al.

[11] Patent Number: 5,610,093
[45] Date of Patent: Mar. 11, 1997

[54] METHOD OF MANUFACTURING A PROGRAMMABLE HYBRID BALANCE NETWORK

[75] Inventors: Salomon Vulih, Neshanic; George R. Briggs, Princeton; Thomas D. Housten, Somerville, all of N.J.

[73] Assignee: Harris Corporation, Melbourne, Fla.

[21] Appl. No.: 527,548

[22] Filed: Sep. 13, 1995

[51] Int. Cl.[6] .................................................. H01L 21/8246
[52] U.S. Cl. .................................................. 437/51; 437/48
[58] Field of Search ........................... 437/7, 48, 51, 437/60, 918; 148/DIG. 136

[56] References Cited

U.S. PATENT DOCUMENTS

| | | | |
|---|---|---|---|
| 4,215,252 | 7/1980 | Onufry, Jr. | 379/406 |
| 4,608,464 | 8/1986 | Morikawa et al. | 379/410 |
| 4,791,668 | 12/1988 | Pringle | 379/398 |
| 4,879,746 | 11/1989 | Young et al. | 379/399 |
| 4,880,754 | 11/1989 | Correale | 437/48 |
| 5,274,703 | 12/1993 | Haughton et al. | 379/401 |
| 5,348,558 | 9/1994 | Ito et al. | 437/51 |
| 5,422,950 | 6/1995 | Miller et al. | 379/399 |
| 5,548,747 | 8/1996 | Rudolph | 437/51 |

*Primary Examiner*—Chandra Chaudhari
*Attorney, Agent, or Firm*—Rogers & Killeen

[57] ABSTRACT

Methods of increasing the number of possible network configurations available during the manufacture of an integrated circuit hybrid balance network containing a fixed number of selectable network configurations in the manufactured network by including a network element selection layer programmable during the manufacturing process. The programming may be accomplished using ROM matrices programmed during or subsequent to the manufacturing process, or alternatively may be accomplished by the programming of the metal masks interconnecting the semiconductor portions of the IC without the necessity for changing the semiconductor masks.

5 Claims, 1 Drawing Sheet

METHOD OF MANUFACTURING A PROGRAMMABLE HYBRID BALANCE NETWORK

BACKGROUND OF THE INVENTION

The present invention relates to a method of manufacturing an integrated circuit ("IC") hybrid balance network for use with a subscriber line interface circuit of a telephone system, and more particularly to a method of manufacturing a IC hybrid balance network with a fixed number of selectable network configurations, where the number of possible configurations of the manufactured network is increased by the manufacturing process.

A telephone system subscriber line interface circuit ("SLIC") connects a balanced two-wire transmission path (the path to and from the subscriber telephone handset) with an unbalanced four-wire transmission path (the path to and from the telephone central station). SLICs perform various functions, including battery feed, overvoltage protection, ringing, signaling, hybrid balancing, and timing.

The four-wire transmission path between the SLIC and central station may employ either analog or digital signals. A digital signal transmission being created by the transmit analog section of a Codec and the digital signal received being converted to an analog signal by the receive analog section of the Codec. A hybrid balance network, placed intermediate to the receive analog section and transmit analog sections of the Codec and connected to the SLIC, cancels any echo between the two Codec sections.

A hybrid balance network typically consists of three sections: a high pass filter, a low pass or equalizer filter, and a gain section. Networks may be uniquely designed to provide a single configuration of filter capacitors and gain controlling amplifier resistors for an identified SLIC. However, the number of network configurations possible for a uniquely identified SLIC may be increased without changing the masks used in the manufacturing process by making the networks programmable, i.e., by selectively switching the fixed number of network elements into and out of the network.

To increase the number of possible network configurations without the need for a new mask in the manufacturing of that network, it is known to include a layer of read only memory, or ROM, intermediate to the switches associated with each circuit element and the underlying circuits of the IC which indicate the desired network configuration. In this way, the ROMs may be blown/programmed in accordance with a particular configuration program in the manufacturing process to thereby determine which of the fixed number of switches is responsive to which signal from the underlying circuit of the IC. While the fixed number of configurations is not increased, the configurations themselves may be changed by this programming in the manufacturing process, and no change in the IC mask is required. Once manufactured, both the number of configurations (determined by the number of switches) and the configuration itself (determined by the interconnection of the switches to the network elements) cannot be changed.

Each of the network sections is configured specifically for the SLIC for which the network will be connected, and the network manufactured for one SLIC will not generally be useful in a different SLIC notwithstanding the fact that the network provides the same fixed number of configurations, i.e., the configurations themselves will be different. Thus new semiconductor masks are required to manufacture a network for each SLIC.

The present invention does not increase the number of configurations available in the manufactured network. However, and in accordance with the present invention, an increased number of possible network configurations are available without the necessity of new semiconductor masks in the manufacturing process. Thus the same semiconductor masks can be used in the manufacture of networks appropriate for a variety of SLICs.

Accordingly, it is an object of the present invention to provide a novel method of manufacturing an IC hybrid balance network.

It is still another object of the present invention to provide a novel method of manufacturing IC hybrid balance networks where the number of possible network configurations selectable during manufacturing is increased without increasing the number of available configurations in the manufactured network.

It is yet still another object of the present invention to provide a novel method of manufacturing IC networks whereby the network configurations may be easily changed without altering the manufacturing process.

It is a further object of the present invention to provide a novel method of manufacturing a programmable impedance element within an IC whereby the possible configurations of the element exceeds the number of controlled switch elements.

In one aspect, one or more ROM matrices may be used with the programming accomplished during or subsequent to the manufacturing process.

It is thus another object of the present invention to provide a novel method of manufacturing plural IC hybrid balance networks using the same masks.

In another aspect, the prior art manufacturing processes for determining which switch was connected to which circuit element, or more specifically where the gain controlling resistor was contacted, used a semiconductor mask to control the configuration of the switches and a metal mask to perform the contacting. The change in the semiconductor mask thus determined the ultimate selection of resistor contact point.

In the present invention, the semiconductor mask is unchanged and the metal mask is changed to thus determine the ultimate resistor contact point. Substantial advantages are obtained by the accomplishment of the programming in the metal mask rather than the semiconductor mask.

Additionally, the number of possible available contact points on the resistor may easily be increased in the mask which defines the resistor, so that far greater flexibility is achieved.

It is accordingly an object of the present invention to provide a novel manufacturing process for hybrid networks in which contacting of switches to circuit elements is controlled by changes in the metal masks rather than changes in the semiconductor masks.

It is thus another object of the present invention to provide a novel manufacturing process for hybrid networks in which the number of possible configurations can be increased without the necessity for changing any semiconductor masks.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
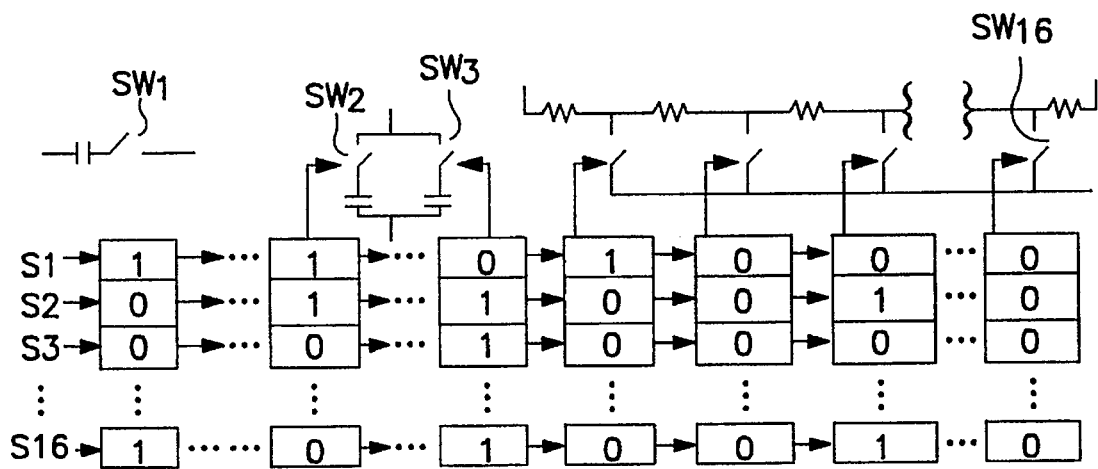
FIG. 1 is a pictorial representation of the operation of the known programmable networks.

FIG. 1 illustrates the operation of a network manufactured by a known process. A single signal from the underlying circuit of the IC is applied as one of S1–S16 access lines to a ROM matrix as an accessing signal. A signal on any one of these 16 access lines will control the operation of all 16 of the switches SW1–SW16, and thus each signal S1–S16 will determine which one of 16 fixed configurations the network will assume.

Since the 16 configurations selected for a particular SLIC will be different from the 16 configurations for a different SLIC, the prior art manufacturing process required new masks to determine different values of the network elements or different connections between the control lines and the switches for each different SLIC.

The method of the subject invention overcomes the disadvantages and problems associated with the prior art by increasing the number of possible network configurations which may be built into the network during its manufacture. In the preferred embodiment, an increased number of additional network elements, e.g., resistor taps, are provided and the metal layer connecting the ROM matrix to the switches includes a second ROM matrix, also programmable in the manufacturing process, to selectively interconnect the control signals to selected taps.

This programmability during manufacturing substantially increases the manufacturing flexibility and permits the manufacturing of hybrid balance networks with a far greater number of possible configurations without altering the manufacturing process or the number of available combinations in the manufactured network.

The programming may also be accomplished by conventional means subsequent to the manufacturing process.

One preferred embodiment of this method of this invention involves the inclusion of a metal ROM layer intermediate the switching layer and the resistive element layer which is programmed during the manufacturing process to determine the exact combination of resistive values available upon providing an accessing signal on one of the ROM selection lines.

Figure 2:
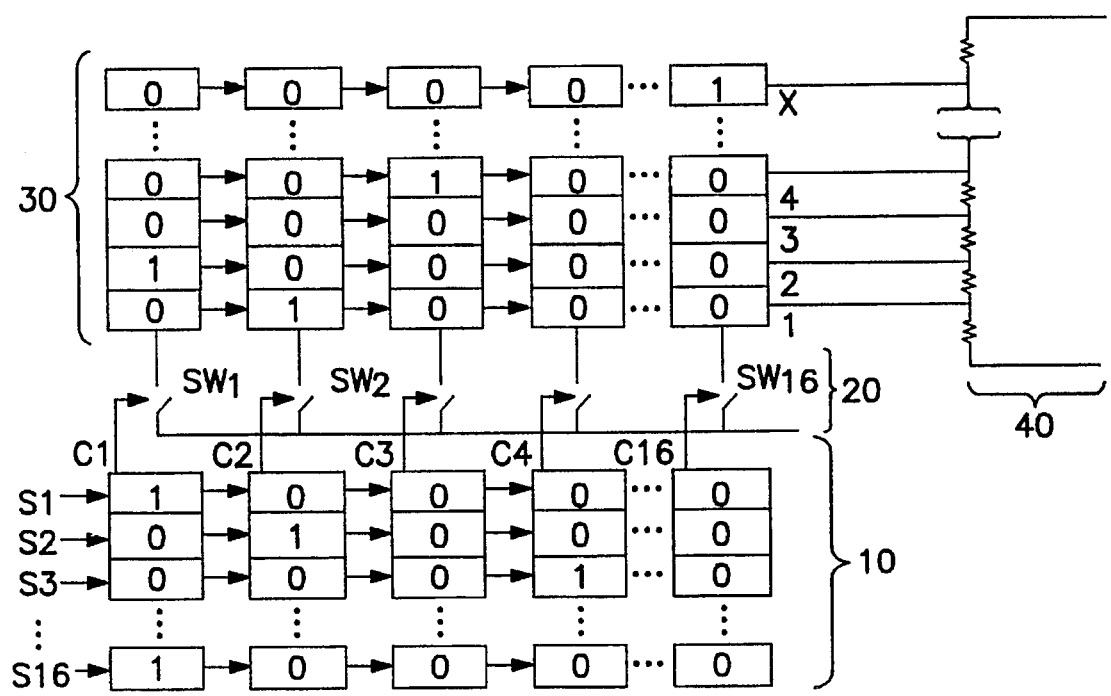
FIG. 2 is a pictorial representation of the operation of a network made by the method of the present invention.

With reference to FIG. 2, the first ROM matrix receives one of 16 selection signals S1–S16 and provides the 16 control signals which control the operation of the 16 switches SW1–SW16.

Because the signals from the switches SW1–SW16 are applied to a second ROM matrix, the second ROM matrix control which of the taps 1-X of the resistor are connected to the switches SW1–SW16. The second ROM matrix, programmable in the manufacturing process in the same manner as the first ROM matrix, thus provides increased flexibility in designing network configurations, i.e., a selection signal S1 which closes SW1 as a result of the programming of the first ROM matrix may now be used in the second ROM matrix to select any one of a number of different taps of the resistor.

As earlier indicated, the number of configurations remains unchanged as it is determined by the number of selection signals S1–S16, but there is increased flexibility in selecting in the manufacturing process the configuration which will result from the presence of each of the signals S1–S16. Because of the increased flexibility in network configuration design, new masks are not required to manufacture the 16 configurations desirable for different SLICs.

The use of ROMs between the switches and the taps of the circuit elements may be avoided by the use of a metal mask. Metal masks are much less expensive and easier to work with than semiconductor masks. Thus the semiconductor masks for the switches may remain unchanged and a metal mask used to determine the connections between the switches and the circuit elements.

While the methods of this invention have been explained in connection with one network utilizing programming of switches to resistor taps, the methods are equally applicable to programming of switches to other network elements, and the network itself may find utility in circuits other than SLICs.

Accordingly, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of manufacturing an integrated circuit hybrid balance network having a fixed number of predetermined network configurations where the network includes a high pass filter section, a low pass filter section, and a gain section, and where each of the sections of the network include one or more switchable circuit elements placed into the network by the selective operation of a switch responsive to a selectively activated one of a plurality of ROM selection lines to thereby configure the network into one of the fixed number of predetermined network configurations, the method comprising the steps of:

a) providing a first N×M ROM matrix with N ROMs for each of M switches in the network, each of the N ROMs being accessible from one of N ROM selection lines to control the selective operation of one or more of the M switches, so that an accessing signal on any one of the N ROM selection lines will control the operation of each of the M switches;

b) selectively programming the first ROM matrix to thereby determine which of the M switches are closed in response to an accessing signal by each of the N ROM selection lines;

(c) providing a second ROM matrix having M×O ROMs with M ROMs for each of the O circuit elements, each of the M ROMS being accessible from one of the M switches to control the connection of such switch to one of the O circuit elements; and (d) selectively programming the second ROM matrix to thereby determine which of the M switches are connected to which of O circuit elements;

whereby the number of possible configurations of switchable elements in the manufacturing of a network is increased without increasing the number of available configurations of switchable elements in the manufactured network.

2. The method of claim 1 wherein O is greater than M.

3. A method of manufacturing a gain controlling element within an integrated circuit including the steps of:

a) providing a resistive element having O taps along the length thereof;

b) providing a plurality of M switchable elements where M<O;

c) providing a programmable ROM matrix intermediate the O resistive elements and the M switchable elements to control the connection of one of the M switchable elements to one of the O resistive elements; and d) selectively programming the ROM matrix to permanently establish which of the M switchable elements are connected to which of the O resistive elements, whereby the number of possible configurations of the gain control element exceeds the number of switchable elements.

4. A method of increasing the number of possible network configurations without changing the process of manufacturing an integrated circuit hybrid balance network with N network configurations, where the network includes O circuit elements and M switchable elements with O>M>N, the method comprising the steps of:

(a) providing a first programmable N×M ROM matrix in the integrated circuit intermediate (i) a circuit for providing one of N selection signals and (ii) the M switchable elements;

(b) providing a second programmable M×O ROM matrix in the integrated circuit intermediate (i) the M switchable elements and (ii) the O circuit elements;

(c) selectively programming the two ROM matrices to thereby determine which of the O circuit elements are included in each of the N configurations in response to one of the N selection signals.

5. A method of manufacturing a programmable, plural tapped, integrated circuit, resistor including the steps of:

(a) providing a plurality of M switches;

(b) providing a resistor having O taps where O>M;

(c) providing a programmable ROM for interconnecting each of the M switches to one of the O taps of the resistor; and (d) selectively programming the ROM matrix during the manufacturing process to thereby determine which of the O taps will be connected to which of the M switches.

* * * * *